United States Patent [19]

Lee et al.

[11] Patent Number: 5,687,128
[45] Date of Patent: Nov. 11, 1997

[54] POWER SUPPLY VOLTAGE BOOSTING CIRCUIT OF SEMICONDUCTOR MEMORY DEVICE

[75] Inventors: Jae-Hyeong Lee, Seoul; Yong-Sik Seok, Suwon, both of Rep. of Korea

[73] Assignee: Samsung Electronics Co., Ltd., Suwon, Rep. of Korea

[21] Appl. No.: 551,005

[22] Filed: Oct. 31, 1995

[30] Foreign Application Priority Data

Dec. 20, 1994 [KR] Rep. of Korea ............... 1994-35330

[51] Int. Cl.[6] .......................................... G11C 13/00
[52] U.S. Cl. .......................... 365/226; 365/189.01
[58] Field of Search .............................. 365/226, 229, 365/789.01, 230.01

[56] References Cited

U.S. PATENT DOCUMENTS 3,942,047 3/1976 Buchanan.
5,245,582 9/1993 Kimura ............................... 365/229

OTHER PUBLICATIONS

K. Furutani et al.; "An Adjustable Output Driver with a Self-Recovering Vpp Generator for a 4M ×16 DRAM"; *IEEE Journal of Solid-State Circuits*, vol. 29, No. 3, Mar. 1994.

Primary Examiner—Terrell W. Fears
Attorney, Agent, or Firm—Cushman Darby & Cushman, IP Group of Pillsbury Madison & Sutro LLP

[57] ABSTRACT

An active power supply voltage boosting circuit for a semiconductor memory device according to the present invention causes operation of the active cycle boosted voltage generating circuit to elevate the level of the boosted power supply voltage $V_{PP}$ when the detected level of the boosted power supply voltage $V_{PP}$ is lower than a target voltage level. Thus, the boosted power supply voltage $V_{PP}$ can be stably maintained to the target voltage level. When the boosted power supply voltage $V_{PP}$ becomes higher than the target voltage level, generation of the boosted power supply voltage $V_{PP}$ is stopped, and as a result, unwanted consumption of the electrical current and also the damage to the semiconductor memory device by high voltage can be prevented.

26 Claims, 5 Drawing Sheets

POWER SUPPLY VOLTAGE BOOSTING CIRCUIT OF SEMICONDUCTOR MEMORY DEVICE

BACKGROUND OF THE INVENTION

The present invention relates to a power supply voltage boosting circuit of a semiconductor memory device, and more particularly, to the power supply voltage boosting circuit in an active mode.

Generally, as a semiconductor memory device such as a DRAM (Dynamic Random Access Memory) have increased integration density and decreased the power supply voltage, the use of a boosted power supply voltage generating circuits has increased. A boosted power supply voltage $V_{PP}$ in semiconductor memory devices is usually used as a word line voltage, and serves to assist in transmitting data represented by a high voltage, or "1" to a memory cell.

The power supply voltage boosting circuit of such semiconductor memory devices additionally includes a stand-by power supply voltage boosting generator ($V_{PP}$ generator) for generating the boosted power supply voltage $V_{PP}$ in a stand-by mode, and an active power supply voltage boosting circuit for generating the boosted power supply voltage $V_{PP}$ in an active mode. The boosted power supply voltage $V_{PP}$ is controlled by dividing the active cycle and the stand-by cycle as described above so that the boosted power supply voltage $V_{PP}$ consumed in the stand-by mode is different from that in the active mode. Because the boosted power supply voltage $V_{PP}$ consumed is small in the stand-by mode, it is possible to maintain the level of the boosted supply voltage $V_{PP}$ using a charge pumping circuit having a small capacity and a power supply voltage boosting circuit having a slow response speed. However, because the boosted power supply voltage $V_{PP}$ consumed in the active cycle is large, it is impossible to maintain the required level of the boosted power supply voltage $V_{PP}$ with the power supply voltage boosting circuit used in the stand-by cycle. Therefore, in the active cycle an active cycle power supply voltage boosting circuit and with a chip master clock MCK are used to quickly obtain the desired boosted power supply voltage $V_{PP}$ and with a charge pumping circuit having a large capacity is used.

FIG. 1 is a block diagram illustrating the structure of the power supply voltage boosting circuit used in semiconductor memory devices, which circuit contains a clock generator 10, a voltage controller 20, and a boosted power supply voltage generator 30. The clock generator 10 receives a row address strobe signal RASB to generate the chip master clock MCK. The voltage controller 20 receives the chip master clock MCK and generates a boost control signal PAKE. The boosted power supply voltage generator 30 performs charging and pumping operations with the boost control signal PAKE and generates the boosted power supply voltage $V_{PP}$.

FIG. 2 is a circuit diagram illustrating the boosted power supply voltage $V_{PP}$ generator 30 of FIG. 1, and FIG. 3 is a waveform illustrating the operating characteristics of each component of FIG. 1. If the row address strobe signal RASB is generated as illustrated in FIG. 3, the clock generator 10 inverts and delays the row address strobe signal RASB to generate the chip master clock MCK. The voltage controller 20 then generates the boost control signal PAKE using the chip master clock MCK. The boosted power supply voltage generator 30 shown in FIGS. 1 and 2 generates the boosted power supply voltage $V_{PP}$ using the boost control signal PAKE. The boosted power supply voltage generates unit 30 illustrated in FIG. 2 inputs the boost control signal PAKE. When the boost control signal PAKE is input and changed from the logic high state to the logic low state, an inverter 33 outputs a signal of the logic low state to a second pumping capacitor 35, which then performs a negative pumping operation to maintain a voltage level of $V_{CC}-V_{TN}$ (wherein, $V_{TN}$ is a threshold voltage of NMOS transistor 38). Inverter 31 also generates a signal of the logic high state to first pumping capacitor 34 which boosts first pumping node N1 from the previous level of $V_{CC}-V_{TN}$ to level of $2V_{CC}-V_{TN}$. The boosted voltage level allows second pumping node N2 to be boosted up to $2V_{CC}-2V_{TN}$ through NMOS transistor 37.

When the boost control signal PAKE is input and changed from the logic low state to the logic high state, the inverter 31 outputs a logic low state signal and first pumping capacitor 34 performs the negative pumping operation. Therefore, the NMOS transistor 37 is turned-off and inverter 33 generates a logic high state signal so that the second pumping capacitor 35 performs the pumping operation. Accordingly, the second pumping node N2 is boosted to a voltage level of $3V_{CC}-2V_{TN}$.

The boosted voltage is output as the boosted power supply voltage $V_{PP}$ through the NMOS transistor 39. Therefore, the boosted power supply voltage $V_{PP}$ may be ideally boosted up to a voltage level of $3V_{CC}-3V_{TN}$. Accordingly, the conventional active power supply voltage boosting circuit as mentioned above generates the boost control signal PAKE every cycle of the chip master clock MCK generated by the row address strobe signal RASB, and the boosted power supply voltage generator 30 generates the boosted power supply voltage $V_{PP}$ by operating once per cycle with the boost control signal PAKE.

In the active power supply voltage boosting circuit mentioned above, the boosted power supply voltage $V_{PP}$ is determined by the pumping capacitors 34 and 35 of the boosted power supply voltage generator 30 and the boost control signal PAKE. The boosted power supply voltage $V_{PP}$ is used as a power supply voltage for activation of a word line, selection of a bit line, and activation of an output driver in the semiconductor memory device. A target voltage level of boosted power supply voltage $V_{PP}$ has to be over a voltage level of $V_{CC}+V_T+\alpha$, wherein, the $V_T$ is a threshold voltage for fully turningon a MOS transistor of a corresponding component, and α represents a back bias effect. Once fully turned on, as a result of activation of the chip master clock MCK, the active cycle lasts until the word line reaches a ground level.

Even when consumption of the boosted power supply voltage $V_{PP}$ is small in this active cycle, the boost control signal PAKE is generated, thereby allowing for, undesirably, the continued increase in the boosted power supply voltage $V_{PP}$. If the boosted power supply voltage $V_{PP}$ becomes higher, the resulting word line voltage on the gate of the memory cell transistor creates an undesirably large electric field which becomes applied to the gate oxide of the MOS transistor and may cause a reliability problem. Further, the amount of electrical current is increased due to the generation of an unnecessary high voltage, thereby increasing the power consumption. Further, when the boosted power supply voltage $V_{PP}$ that is consumed in the active cycle becomes large, the boosted power supply voltage $V_{PP}$ can be lower than the target voltage level of $V_{CC}+V_T+\alpha$, which may result in an insufficient voltage and not allow a complete high level "1" signal to be transmitted to the memory cell.

SUMMARY OF THE INVENTION

It is an object of the present invention to provide an active power supply voltage boosting circuit in a semiconductor memory device for generating a stabilized boosted power supply voltage $V_{PP}$ in an active cycle.

It is another object of the present invention to provide an active power supply voltage boosting circuit in the semiconductor memory device which detects a level of a boosted power supply voltage $V_{PP}$ in an active cycle, and when the detected voltage level is lower than the target voltage level, raises the level of the boosted power supply voltage $V_{PP}$.

It is still another object of the present invention to provide an active power supply voltage boosting circuit in the semiconductor memory device which detects a level of a boosted power supply voltage $V_{PP}$ in an active cycle, and when the detected voltage level is higher than the target voltage level, non-activates operation of the power supply voltage boosting circuit.

To achieve these and other objects, the active power supply voltage boosting circuit according to the present invention causes operation of the active cycle boosted voltage generating circuit to elevate the level of the boosted power supply voltage $V_{PP}$ when the detected level of the boosted power supply voltage $V_{PP}$ is lower than a target voltage level. Thus, the boosted power supply voltage $V_{PP}$ can be stably maintained to the target voltage level. When the boosted power supply voltage $V_{PP}$ becomes higher than the target voltage level, generation of the boosted power supply voltage $V_{PP}$ is stopped, and as a result, unwanted consumption of the electrical current and also the damage to the semiconductor memory device by high voltage can be prevented.

This operation is possible through the use of an active cycle detecting unit and a boosted power supply voltage detecting unit, which are used in conjunction with a clock generating circuit, an oscillating circuit and a boosted power supply voltage generating unit. Accordingly, a desired boosted power supply voltage level is maintained, but the boosted power supply voltage is generated only when it is needed.

BRIEF DESCRIPTION OF THE DRAWINGS

A more complete appreciation of the invention, and many of the attendant advantages thereof, will become apparent with reference to the following detailed description considered in conjunction with the accompanying drawings in which like reference symbols indicate the same or similar components, wherein.

DETAILED DESCRIPTION OF THE PREFERRED EMBODIMENTS

Certain terms used hereinafter are described to provide a more thorough understanding of the present invention. The term "row address strobe signal" (RASB) refers to a chip enable clock, and particularly to a signal which prepares the circuit for receiving a row address signal. The term "chip master clock" (MCK) refers to a signal generated by the row address strobe signal RASB. A detection enable signal PDET activates a boosted power supply voltage detector in the active cycle. An oscillation cycle control signal POSC sets a cycle which generates a boosted power supply voltage $V_{PP}$ when the level of the boosted power supply voltage $V_{PP}$ is lower than a target voltage level in the state that the detection enable signal PDET is activated. A boost control signal PAKE is an oscillating square wave signal which initiates the power supply voltage boosting operation when the oscillation cycle control signal POSC is activated.

Figure 1:
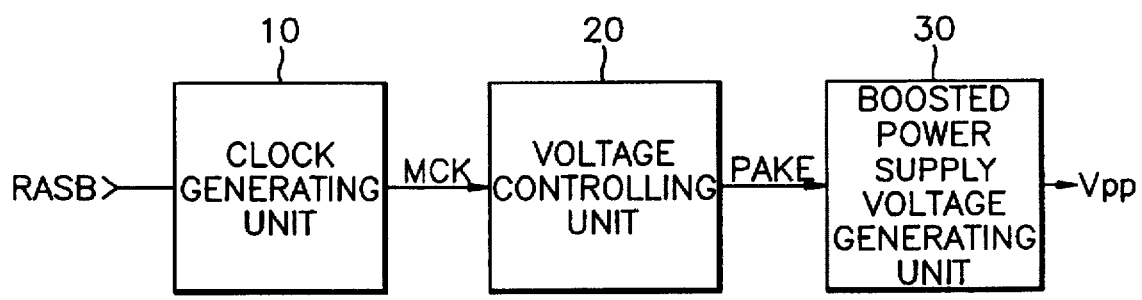
FIG. 1 is a block diagram illustrating construction of a conventional active node power supply voltage boosting circuit for a semiconductor memory device.
Figure 2:
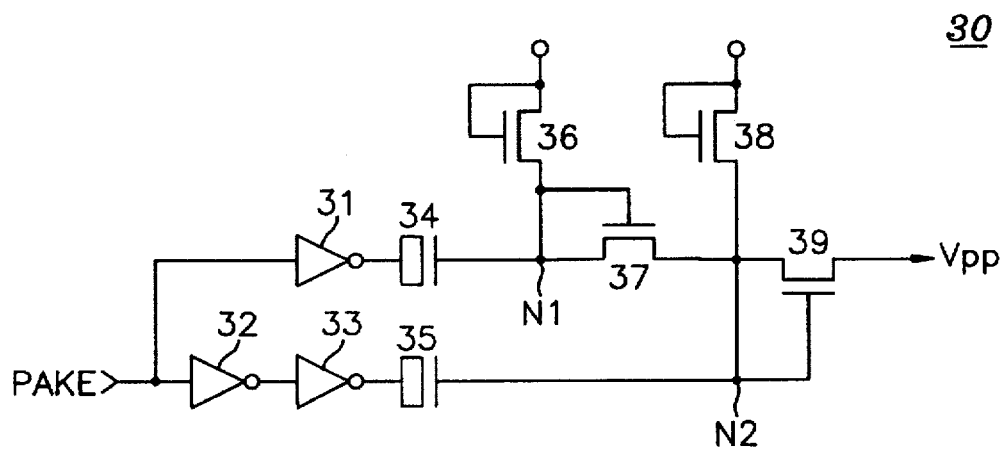
FIG. 2 is a circuit diagram illustrating the boosted power supply voltage generator of FIG. 1.
Figure 3:
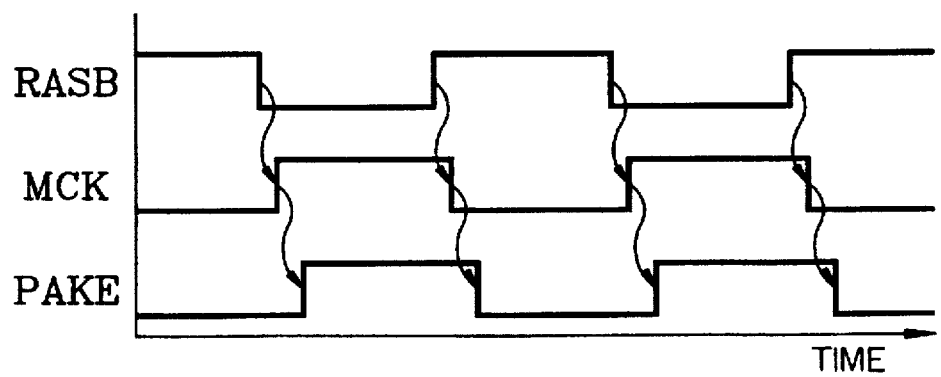
FIG. 3 is a waveform illustrating operational characteristics of the FIG. 1 power supply voltage boosting circuit.
Figure 4:
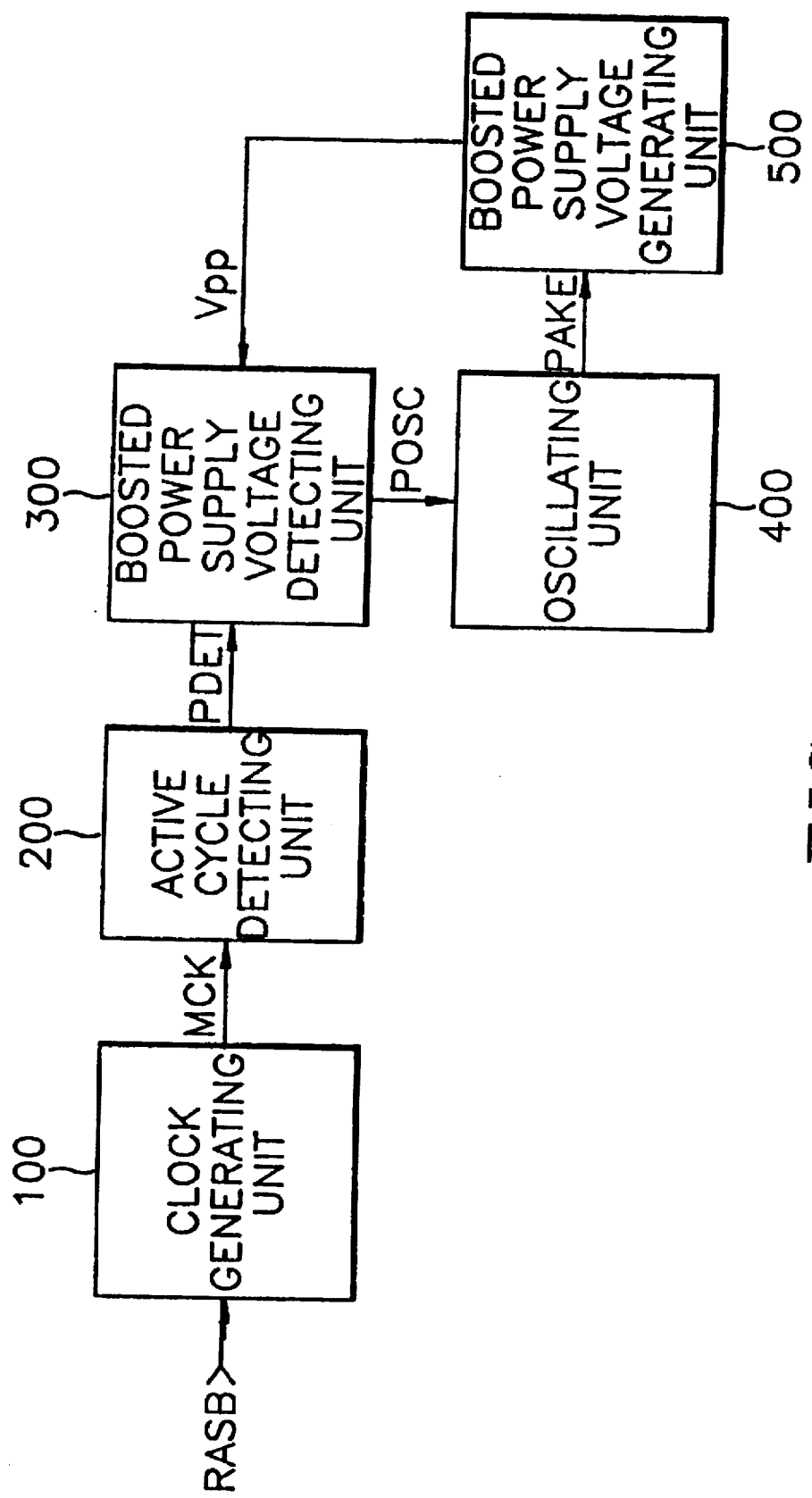
FIG. 4 is a block diagram illustrating an active mode power supply voltage boosting circuit for a semiconductor memory device according to the present invention.

FIG. 4 is a block diagram illustrating an active mode power supply voltage boosting circuit for a semiconductor memory device constructed according to the principles of the present invention. A clock generating unit 100 inputs the row address strobe signal RASB, which converts the chip into an active state and generates the chip master clock MCK. An active cycle detecting unit 200 inputs the chip master clock MCK and outputs a detection enable signal PDET. Detection enable signal PDET assists in maintaining the chip master clock MCK in a given cycle, even when the chip master clock is generated in a short cycle.

The detection enable signal PDET output from the active cycle detecting unit 200 is applied to the boosted power supply voltage detecting unit 300. The boosted power supply voltage detecting unit 300 detects the level boosted power supply voltage $V_{PP}$ output from the boosted voltage generating unit 500, being activated when the detection enable signal PDET from the active cycle detecting unit 200 is received. When the detected voltage level is lower than the target voltage level detecting unit 300 generates an oscillation cycle control signal POSC, which is used to initiate generation of the boosted power supply voltage $V_{PP}$. However, when the level of the boosted power supply voltage $V_{PP}$ is higher or equal than/to the target voltage level, the boosted power supply voltage detecting unit 300 turns off the oscillation cycle control signal POSC to stop continued generation of boosted power supply voltage $V_{PP}$.

The oscillation cycle control signal POSC is input as the control signal of the oscillating unit 400. The generating unit 400 inputs the oscillation cycle control signal POSC and is activated when the oscillation cycle control signal POSC is maintained in the logic high state to generate the boost control signal PAKE. The boost control signal PAKE is a square wave oscillating signal and the oscillating unit 400 can be embodied as a ring oscillator as described further hereinafter in FIG. 7.

The boost control signal PAKE, which is a pulse signal of the square wave, is applied to the boosted voltage generating unit 500. The boosted voltage generating unit 500 performs a pumping operation in accordance with the boost control signal PAKE being input to generate the boosted power supply voltage $V_{PP}$. The boosted voltage generating circuit 500 can be embodied as two charge pumping circuits as described further hereinafter in FIG. 8.

Figure 5:
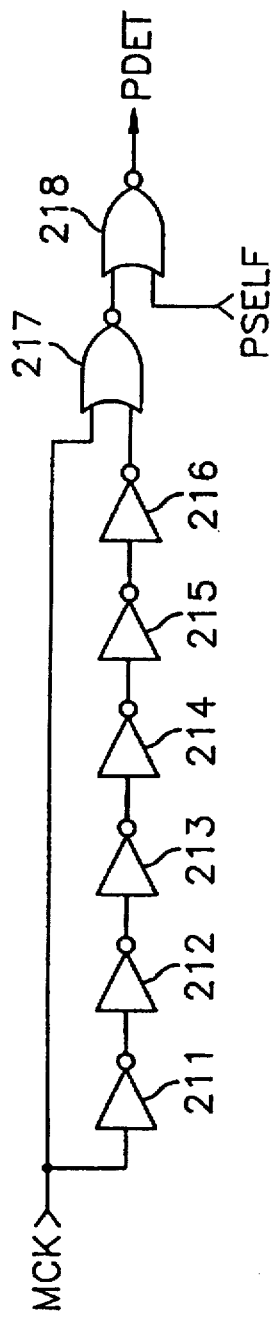
FIG. 5 is a detailed circuit diagram illustrating the active cycle detecting unit of FIG. 4.

FIG. 5 shows an embodiment of the active cycle detecting unit 200. In this embodiment, inverters 211–216 form a chain of inverters which receive the chip master clock MCK and are used as a delaying unit. NOR gate 217 NORs the chip master clock MCK and the delayed chip master clock MCK to generate the detection enable signal PDET. That is, if the chip master clock MCK of the logic high signal is input, it is input directly to NOR gate 217, as well as being delayed through the chain of inverters 211–216 and then input to NOR gate 217. This ensures that the detection enable signal PDET remains present for the period of time of the chip master clock MCK delayed by inverters 211–216. This prevents the boosted power supply voltage generating unit 500 from undesirably turning off when the row address strobe signal RASB is generated during a short cycle. Thus, the active cycle detecting unit 200 generates the detection enable signal PDET for a period that is extended by a given cycle in order to generate the boosted power supply voltage $V_{PP}$ of the active cycle, even if the chip master clock MCK is generated during a short cycle. The delay period of time can be controlled by adding or subtracting the number of the inverters in the chain of inverters.

A NOR gate 218 NORs an output of a self refresh mode signal PSELF and the NOR gate 217, thereby generating the detection enable signal PDET of the logic high state. The self refresh mode signal PSELF is the signal generated in the logic high state during self refresh mode. The cycle at the self refresh mode is several tens of μsec, and therefore the capacity of the stand-by power supply voltage boosting circuit is enough to generate the PDET signal. Accordingly, it is preferable to reduce consumption of the electrical current by de-activating the active power supply voltage boosting circuit during the self refresh mode. Therefore, the self refresh mode signal PSELF is input as a logic high signal during the self refresh mode, but as a logic low signal during the other modes. The refresh mode detection enable signal PDET output through the NOR gate 218 is cut off in the self refresh mode.

Figure 6:
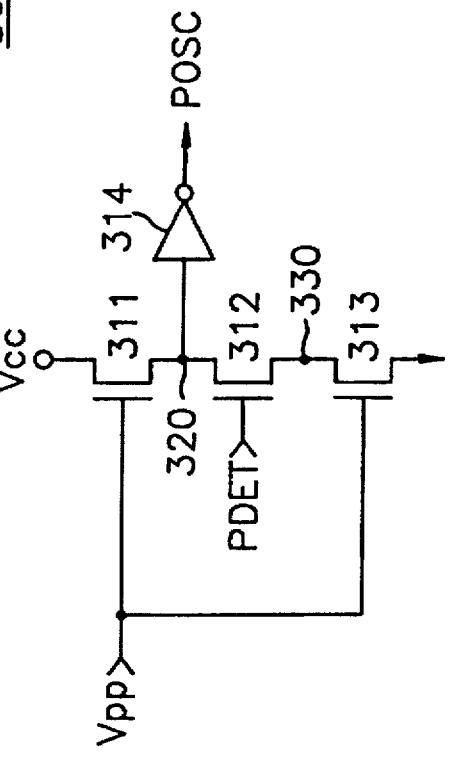
FIG. 6 is a detailed circuit diagram illustrating the boosted power supply voltage detecting unit of FIG. 4.

FIG. 6 is a detailed circuit diagram illustrating the boosted voltage detecting unit 300, which is comprised of a first NMOS transistor 311, a second NMOS transistor 312, a third NMOS transistor 313, and an inverter 314. The first NMOS transistor 311 is coupled between the power supply voltage $V_{CC}$ and a first connection node 320 and connected to the boosted power supply voltage $V_{PP}$ at a gate electrode thereof. The second NMOS transistor 312 is coupled between the first connection node 320 and a second connection node 330 and connected to the detection enable signal PDET at the gate electrode thereof. The third NMOS transistor 313 is coupled between the second connection node 330 and ground $V_{SS}$ and connected to the boosted power supply voltage $V_{PP}$ at the gate electrode thereof. The inverter 314 is connected to the first connection node 320 and sets the logic state of the oscillation cycle control signal POSC in accordance with the voltage level detected at the first connection node 320.

First, if the detection enable signal PDET is generated as a logic low signal, the second NMOS transistor 312 is maintained in the turned-off state, and therefore a logic high signal is generated at the first connection node 320. Inverter 314 thus inverts the logic high signal of first connection node 320 to generate a logic low state oscillation cycle control signal POSC. Accordingly, if the detection enable signal PDET is at a logic low state, the active cycle is not present. Thus, the second NMOS transistor 312 is turned-off, and the boosted power supply voltage detecting unit 300 is de-activated irrespective of the level of the boosted power supply voltage $V_{PP}$.

However, if a logic high state detection enable signal PDET is input this indicates that it is the active cycle, and the second NMOS transistor 312 is turned-on. The second NMOS transistor 312 has a fixed channel resistance value once turned on, which is used as reference resistance for detecting the target voltage level of the boosted power supply voltage $V_{PP}$. When the second NMOS transistor 312 is turned-on, the first NMOS transistor 311 and the third NMOS transistor 313 are operated as variable resistances in accordance with the level of the boosted power supply voltage $V_{PP}$. That is, as the boosted power supply voltage $V_{PP}$ is increased, the first NMOS transistor 311 and the third NMOS transistor 313 turn-on more fully, thereby increasing the amount of the electrical current applied to the first connection node 320. Since the amount of the electrical current applied to the third NMOS transistor 313 by the fixed channel resistance of the second NMOS transistor 312 is smaller than that of the electrical current flowing through the first NMOS transistor 311, a logic high voltage is eventually detected at the first connection node 320. Inverter 314 then inverts the logic high state detected voltage to generate a logic low state oscillation cycle control signal POSC. This indicates that the boosted power supply voltage $V_{PP}$ is being generated as the target voltage level or higher, and the logic low state oscillation control signal POSC thus causes the boosted power supply voltage generating unit 500 to enter a non-active state.

If the boosted power supply voltage generating unit 500 is de-activated so that generation of the boosted power supply voltage $V_{PP}$ is stopped, the level of the boosted power supply voltage $V_{PP}$ is gradually lowered. The channel resistances of the first NMOS transistor 311 and the third NMOS transistor 313 are then proportionally increased as the level of the voltage $V_{PP}$ is lowered. As mentioned above, if the channel resistance is increased due to the level of the boosted power supply voltage $V_{PP}$ being lowered, the amount of the electrical current flowing through the first NMOS transistor 311 and the third NMOS transistor 313 is reduced. The voltage level of the second connection node 330 is lowered by the third NMOS transistor 330 coupled between the second connection node 330 and the ground $V_{SS}$, thereby generating a voltage difference between the first connection node 320 and the second connection node 330. Accordingly, as the charge of the first connection node 320 leaks to the second connection node 330 through the second NMOS transistor 312, the voltage level of the first connection node 320 is rapidly lowered. If the voltage of the first connection node 320 is lowered below a trip voltage of the inverter 314, the inverter 314 generates the oscillation cycle control signal POSC of the high logic state. The logic high state oscillation cycle control signal POSC is a cycle signal for activating the boosted power supply voltage generating unit 500 and is maintained until the boosted power supply voltage $V_{PP}$ rises to the target voltage level. Accordingly, if the boosted power supply voltage $V_{PP}$ becomes lower than the target voltage by a predetermined voltage amount, the boosted voltage generating unit 300 activates the oscillation cycle control signal POSC.

Figure 7:
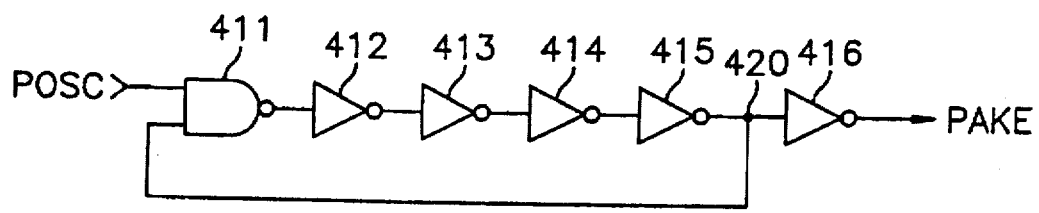
FIG. 7 is a detailed circuit diagram illustrating the oscillating unit of FIG. 4.

Referring to FIG. 7, generation unit 400 includes a NAND gate 411 having inputs connected to the oscillation cycle control signal POSC and a connection node 420. NAND gate 411 outputs a signal of the logic high state to de-activate oscillating operation during the interval when the oscillation cycle control signal POSC is input at the logic low state. When the signal POSC is input at the logic high state, the square wave oscillating signal is generated in accordance with the logic state of the connection node 420. Inverters 412–415 coupled between the NAND gate 411 and the connection node 420 determine the cycle of the oscillating signal. The number of such inverters can be varied to precisely defer the cycle time. Accordingly, if the oscillation cycle control signal POSC is activated, the oscillating unit 400 generates the boost control signal PAKE in accordance with the cycle determined by the NAND gate 411 and the inverters 412–415.

Figure 8:
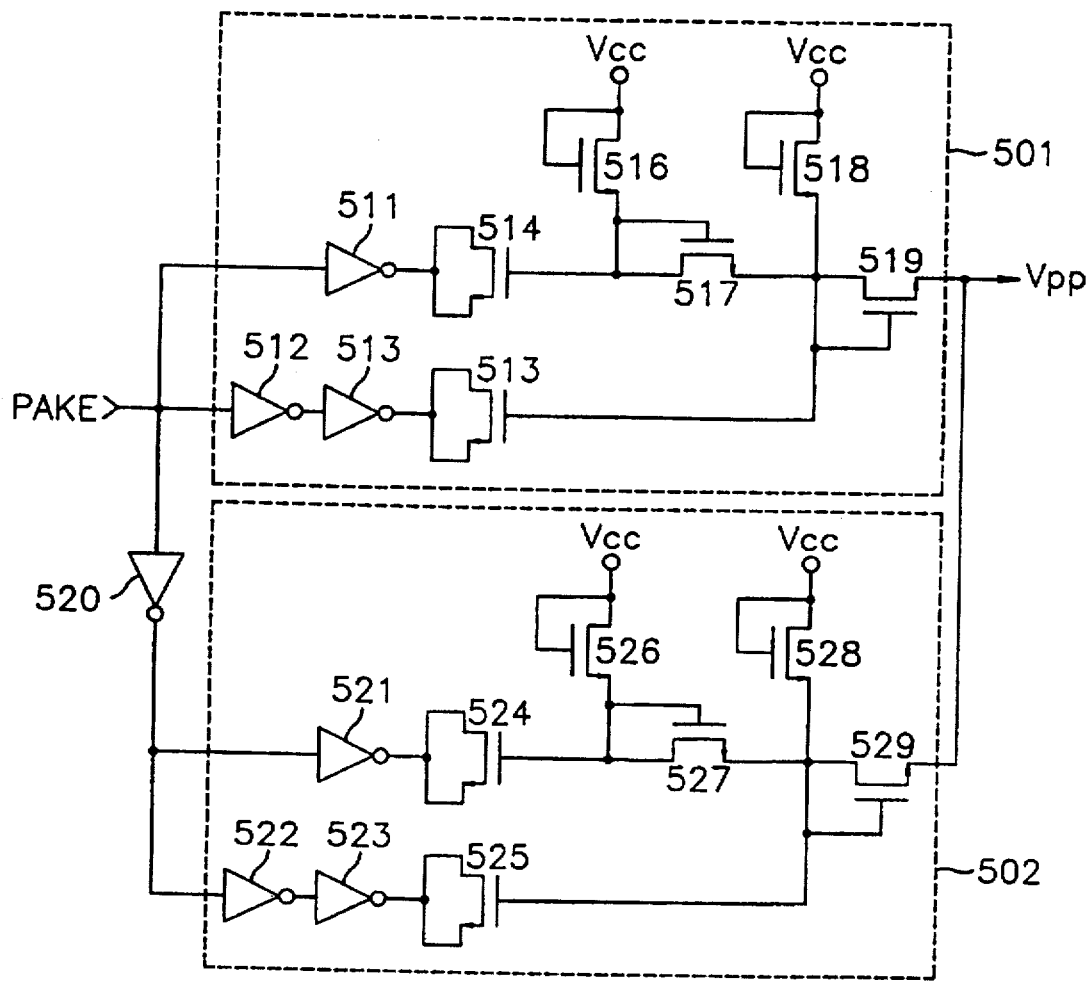
FIG. 8 is a detailed circuit diagram illustrating the boosted power supply voltage generating unit of FIG. 4.

As shown in FIG. 8, the boosted power supply voltage generating unit 500 is comprised of a first charge pumping circuit 501 and a second charge pumping circuit 502.

In the stand-by state, the first charge pumping circuit 501 is precharged to the power supply voltage $V_{CC}$ level by MOS transistors 516 and 518, and the second charge pumping circuit 502 is precharged to the power supply voltage $V_{CC}$ level by MOS transistors 526 and 528. If the boost control signal PAKE is received and changed from the logic high state to the logic low state, the boosted power supply voltage $V_{PP}$ is output at a voltage level substantially twice that of the power supply voltage $V_{CC}$ level by pumping capacitors 514 and 525. However, when the boost control signal PAKE is changed from the logic low state to the logic high state, the boosted power supply voltage $V_{PP}$ is output as substantially twice that of the power supply voltage $V_{CC}$ level by the pumping capacitors 514 and 524. Since the boosted power supply voltage $V_{PP}$ is generated by two charge pumping circuits 501 and 502, the boosted power supply voltage $V_{PP}$ is rapidly raised to the target voltage level.

The boosted power supply voltage $V_{PP}$ is then used as a power supply voltage to enable word lines, select bit lines, and activate output drivers in the semiconductor memory device. The boosted power supply voltage 300 is also applied to the boosted voltage detecting unit 300 so that its level can be detected as described previously. These operations are repeated until the boosted power supply voltage $V_{PP}$ is raised to the target voltage level.

Figure 9:
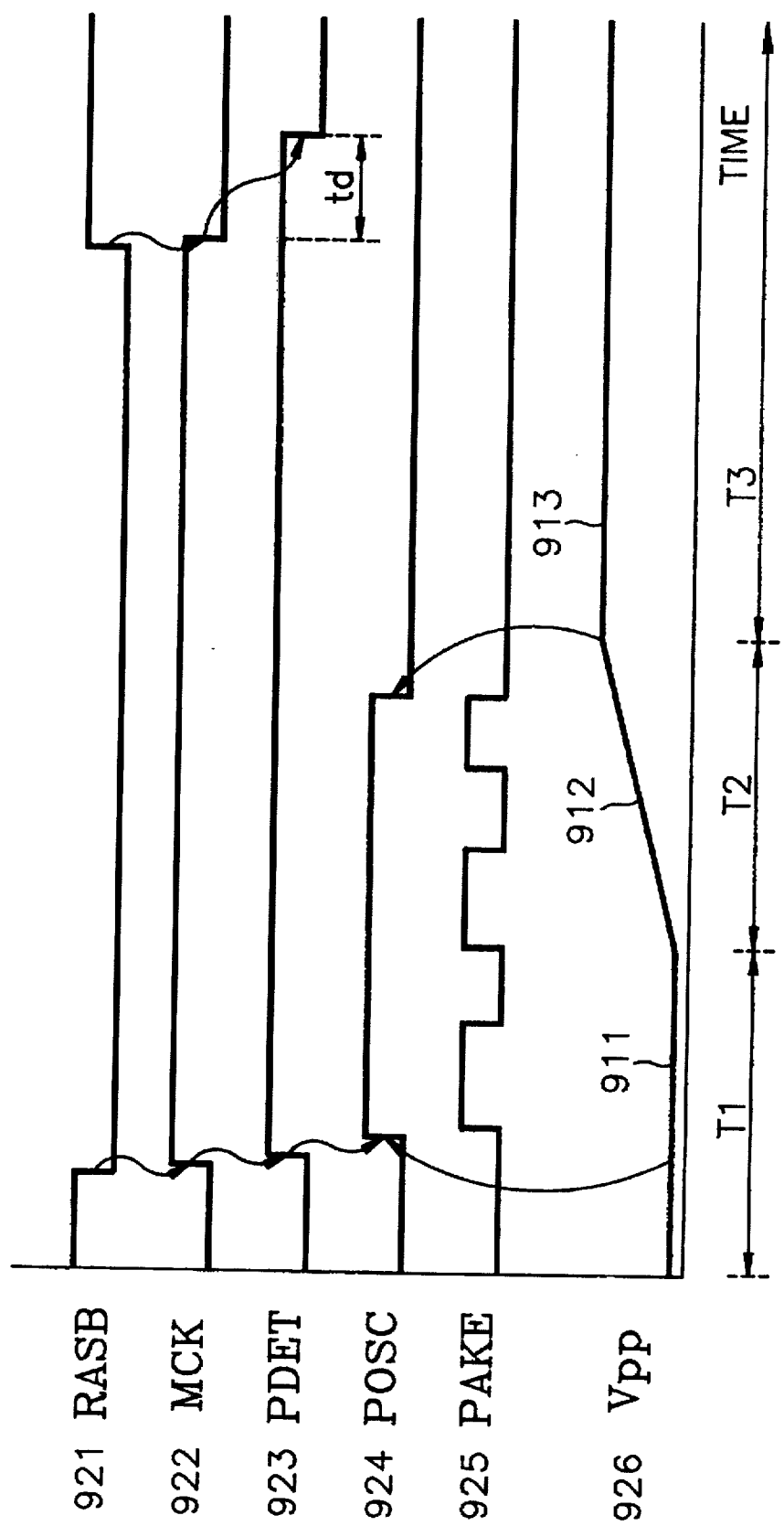
FIG. 9 is a waveform illustrating operation characteristics of the active mode power supply voltage boosting circuit according to the present invention.

FIG. 9 is a waveform illustrating the operation of each circuit component previously described when the stand-by state is changed into the active state, the row address strobe signal RASB changes from the logic high state to the logic low state, as shown in waveform 921 of FIG. 9. The clock generating unit 100 then inverts the received RASB signal to generate the chip master clock MCK at a logic high state, as shown in waveform 922 of FIG. 9. Further, the active cycle detecting unit 200 inputs the chip master clock MCK and generates the logic high state detection enable signal PDET for activating the boosted voltage detecting unit 300 with the chip master clock MCK, as shown in waveform 923 of FIG. 9. As described previously, the detection enable signal PDET is maintained in the logic high state for a delay period td after the chip master clock MCK returns to a logic low state to, ensure generation of the boosted power supply voltage $V_{PP}$ during a short cycle. Once detection enable signal PDET is generated the oscillating square wave boost control signal PAKE is generated and output from the oscillating unit 400 shown in waveform 925 of FIG. 9. The boosted power supply voltage $V_{PP}$ is obtained by driving of the boosted voltage generating unit 500 using the boost control signal PAKE.

If the detection enable signal PDET is generated in the logic high state to indicate an active cycle, the second NMOS transistor 3 12 from FIG. 6 is turned-on to allow detection of the boosted power supply voltage $V_{PP}$ level. In a first period T1 when the active cycle starts to be activated, the boosted voltage generating unit 500 generates the power supply voltage $V_{CC}$ as the boosted power supply voltage $V_{PP}$, as shown in waveform portion 911 of FIG. 9. Accordingly, the boosted power supply voltage detecting unit 300 as shown in FIG. 6 continues to generate the logic high state oscillation cycle control signal POSC as shown in waveform 924 of FIG. 9. As a result, the oscillating unit 400 shown in FIG. 7 continues to generate the boost control signal PAKE as shown in the waveform 925. As a result, the boosted power supply voltage generating unit 500 shown in FIG. 8 generates the boosted power supply voltage $V_{PP}$ having a level that rises at a high speed as shown in a waveform 926 of FIG. 9 Accordingly, the boosted power supply voltage $V_{PP}$ starts to rise to the target voltage level as shown at waveform portion 912 during a second period T2.

Once the $V_{PP}$ level rises to the target voltage level, the detecting unit 300 generates logic low state oscillation cycle control signal POSC as shown in the waveform 925. Thus, the oscillating unit 400 does not continue to generate the boost control signal PAKE, and, as a result, the boosted power supply voltage generating unit 500 does not generate the boosted power supply voltage $V_{PP}$. The boosted power supply voltage $V_{PP}$ output from the boosted voltage generating unit 500 is thereafter maintained at the target voltage level as shown in a waveform 913 of FIG. 9. If the level of the boosted power supply voltage $V_{PP}$ thereafter becomes lower than the target voltage level by a predetermined voltage amount, the operation as described above is repeated in order to again elevate the voltage $V_{PP}$ level up to the target voltage level.

While the invention has been particularly shown and described with reference to a preferred embodiment thereof, it will be understood by those skilled in the art that foregoing and other changes in form and details may be made without departing from the spirit and scope of the invention.

What is claimed is:

1. A power supply voltage boosting circuit of a semiconductor memory device comprising:

a boosted power supply voltage detecting circuit which, when an active cycle signal is input, generates an activation oscillation control signal when a boosted power supply voltage is lower than a target voltage level; and a boosted power supply voltage generating circuit which, when said activation oscillation control signal is input, generates said boosted power supply voltage.

2. A power supply voltage boosting circuit according to claim 1 wherein said boosted power supply voltage generating circuit includes:

an oscillator which receives said activation oscillation control signal and generates an oscillating signal having a predetermined cycle: and a charge pump circuit which receives said oscillating signal and generates said boosted power supply voltage.

3. A power supply voltage boosting circuit according to claim 1, wherein said boosted power supply voltage detecting circuit comprises:

a first transistor coupled between a power supply voltage and a first connection node and having a first gate electrode connected to receive said boosted power supply voltage;

a second transistor coupled between said first connection node and a second connection node and having a second gate electrode connected to receive said active cycle signal, said second transistor having a fixed channel resistance which determines said target voltage level when said active cycle signal is received;

a third transistor coupled between said second connection node and a ground voltage and having a third gate electrode connected to receive said boosted power supply voltage, said first and third transistors having channel resistances which vary according to changing levels of said boosted power supply voltage;

an output detection circuit connected to said first connection node which uses a potential of said first connection node to generate said oscillation cycle control signal.

4. A power supply voltage boosting circuit according to claim 3, wherein said output detection circuit is an inverter having a trip point.

5. A power supply voltage boosting circuit according to claim 3, wherein said first, second and third transistors are each an NMOS transistor.

6. A power supply voltage boosting circuit according to claim 2, wherein said oscillator is a ring generator.

7. A power supply voltage boosting circuit according to claim 2, wherein said charge pump circuit includes two charge pumping circuits, each charge pumping circuit having a pair of capacitors.

8. A power supply voltage boosting circuit according to claim 1 wherein said active cycle signal is a row address strobe signal.

9. A power supply voltage boosting circuit according to claim 8 further including an active cycle detector for maintaining said active cycle signal for a predetermined period longer than said row address strobe signal.

10. A power supply voltage boosting circuit of a semiconductor memory device comprising:

an active cycle detector for generating a detection enable signal during an active cycle and maintaining said detection enable signal for a predetermined period longer than said active cycle;

a boosted power supply voltage detecting circuit which, when said detection enable signal is input, generates an activation oscillation control signal when a boosted power supply voltage is lower than a target voltage level; and a boosted power supply voltage generating circuit which, when said activation oscillation control signal is input, generates said boosted power supply voltage.

11. A power supply voltage boosting circuit according to claim 10 wherein said boosted power supply voltage generating circuit includes:

an oscillator which receives said activation oscillation control signal and generates an oscillating signal having a predetermined cycle: and a charge pump circuit which receives said oscillating signal and generates said boosted power supply voltage.

12. A power supply voltage boosting circuit according to claim 11, wherein said boosted power supply voltage detecting circuit comprises:

a first transistor coupled between a power supply voltage and a first connection node and having a first gate electrode connected to receive said boosted power supply voltage;

a second transistor coupled between said first connection node and a second connection node and having a second gate electrode connected to receive said detection enable signal, said second transistor having a fixed channel resistance which determines said target voltage level when said detection enable signal is received;

a third transistor coupled between said second connection node and a ground voltage and having a third gate electrode connected to receive said boosted power supply voltage, said first and third transistors having channel resistances which vary according to changing levels of said boosted power supply voltage;

an output detection circuit connected to said first connection node which uses a potential of said first connection node to generate said oscillation cycle control signal.

13. A power supply voltage boosting circuit according to claim 12, wherein said output detection circuit is an inverter having a trip point.

14. A power supply voltage boosting circuit according to claim 12, wherein said first, second and third transistors are each an NMOS transistor.

15. A power supply voltage boosting circuit according to claim 11, wherein said oscillator is a ring generator.

16. A power supply voltage boosting circuit according to claim 15, wherein said charge pump circuit includes two charge pumping circuits, each charge pumping circuit having a pair of capacitors.

17. A power supply voltage boosting circuit according to claim 8, wherein said active cycle detector inputs an active cycle signal, delays said active cycle signal to create a delayed active cycle signal and creates said detection enable signal by logically combining said active cycle signal with said delayed active cycle signal.

18. A power supply voltage boosting circuit according to claim 17 wherein said active cycle detector uses a chain of inverters to create said delayed active cycle signal.

19. A power supply voltage boosting circuit according to claim 17 wherein said active cycle signal is a row address strobe signal.

20. A power supply voltage boosting circuit of a semiconductor memory device comprising:

a clock generator which receives an active cycle signal and generates a master clock signal;

an active cycle detector for generating a detection enable signal using said master clock signal and a self refresh mode signal, said active cycle detector maintaining said detection enable signal for a predetermined period longer than said master clock signal and deactivating said detection enable signal when said self refresh mode signal is received;

a boosted power supply voltage detecting circuit which, when said detection enable signal is input, generates an activation oscillation control signal when a boosted power supply voltage is lower than a target voltage level; and a boosted power supply voltage generating circuit which, when said activation oscillation control signal is input, generates said boosted power supply voltage.

21. A power supply voltage boosting circuit according to claim 20 wherein said boosted power supply voltage generating circuit includes:

an oscillator which receives said activation oscillation control signal and generates an oscillating signal having a predetermined cycle: and a charge pump circuit which receives said oscillating signal and generates said boosted power supply voltage.

22. A power supply voltage boosting circuit according to claim 21, wherein said boosted power supply voltage detecting circuit comprises:

a first transistor coupled between a power supply voltage and a first connection node and having a first gate electrode connected to receive said boosted power supply voltage;

a second transistor coupled between said first connection node and a second connection node and having a second gate electrode connected to receive said detection enable signal, said second transistor having a fixed channel resistance which determines said target voltage level when said detection enable signal is received;

a third transistor coupled between said second connection node and a ground voltage and having a third gate electrode connected to receive said boosted power supply voltage, said first and third transistors having channel resistances which vary according to changing levels of said boosted power supply voltage;

an output detection circuit connected to said first connection node which uses a potential of said first connection node to generate said oscillation cycle control signal.

23. A power supply voltage boosting circuit according to claim 22, wherein said output detection circuit is an inverter having a trip point.

24. A power supply voltage boosting circuit according to claim 23, wherein said first, second and third transistors are each an NMOS transistor.

25. A power supply voltage boosting circuit according to claim 24, wherein said active cycle detector inputs an active cycle signal, delays said active cycle signal to create a delayed active cycle signal and creates said detection enable signal by logically combining said active cycle signal with said delayed active cycle signal.

26. A power supply voltage boosting circuit according to claim 25 wherein said active cycle detector uses a chain of inverters to create said delayed active cycle signal.

* * * * *